US006648149B2

(12) United States Patent
Robertson

(10) Patent No.: US 6,648,149 B2
(45) Date of Patent: Nov. 18, 2003

(54) RACK LATCH ASSEMBLY

(75) Inventor: Kenneth G. Robertson, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/085,746

(22) Filed: Feb. 28, 2002

(65) Prior Publication Data

US 2003/0160010 A1 Aug. 28, 2003

(51) Int. Cl.⁷ .................................................. A47F 5/00
(52) U.S. Cl. ........................ 211/26; 312/223.2; 361/801
(58) Field of Search ............................ 361/726, 732, 361/801; 211/26; 312/265.1, 265.2, 265.3, 265.4, 265.5, 265.6, 223.2

(56) References Cited

U.S. PATENT DOCUMENTS

| | | | | |
|---|---|---|---|---|
| 5,557,499 A | * | 9/1996 | Reiter et al. | 312/223.2 X |
| 6,021,909 A | | 2/2000 | Tang et al. | 311/183 |
| 6,052,278 A | * | 4/2000 | Tanzer et al. | 312/223.2 X |
| 6,230,903 B1 | | 5/2001 | Abbott | 211/26 |
| 6,288,902 B1 | * | 9/2001 | Kim et al. | 361/801 X |
| 6,381,146 B1 | * | 4/2002 | Sevier | 361/801 X |
| 6,395,976 B1 | * | 5/2002 | Koradia et al. | 361/801 X |
| 6,456,501 B1 | * | 9/2002 | Rubenstein et al. | 361/801 X |
| 6,490,153 B1 | * | 12/2002 | Casebolt et al. | |
| 6,512,679 B1 | * | 1/2003 | Shearman et al. | 361/801 X |

* cited by examiner

Primary Examiner—Robert W. Gibson, Jr.

(57) ABSTRACT

A rack latch assembly for securing a product and bezel to a rack, including a latch bracket for securing to the product; a latch, extending from the latch bracket, for latching to the rack; and a lever, rotatably secured in the bezel, for releasing the latch from the rack during rotation.

16 Claims, 6 Drawing Sheets

RACK LATCH ASSEMBLY

TECHNICAL FIELD

The subject matter disclosed here generally relates to racks, and more particularly, to a rack latch assembly for securing a product and a bezel to a support member.

BACKGROUND

A "rack" is a frame or cabinet for holding other equipment, such as servers and/or other electronic components. Various "rackmount" kits are available from Hewlett-Packard in order to provide support members (including, but not limited to, rails and slides) for mounting various components inside its NetServer racks. For example, U.S. Pat. No. 6,021,909 to Tang et al. (and assigned at issuance to Hewlett-Packard Company) discloses a rail system for use in an equipment enclosure and is incorporated by reference here. Similarly, U.S. Pat. No. 6,230,903 to Abbot (also assigned at issuance to Hewlett-Packard Company) discloses a rack support rail system and is also incorporated by reference here.

Various racks and/or rackmounts are provided with coverings for shielding the internal components from view. For example, the HP9000/Series 800 E-Class Server Rack Mount Kit, available from Hewlett-Packard Corporation, is provided with a plastic bezel that snaps to a frame assembly which is then screwed to the support rails. Typically, such plastic bezels are arranged so as to cover, or otherwise hide, the rack latch that secures the components inside the rack. However, this means that the bezel must be removed in order to access the latch. Other devices have been provided with exposed levers that operate the rack latch. However, since the bezels are typically installed independently of the levers, it can be difficult to properly align the bezel with all of the mating parts. In addition, these types of solutions generally do not sufficiently hide the less aesthetically-pleasing parts of the rack.

SUMMARY

These and other drawbacks of conventional technology are addressed here by providing a rack latch assembly for securing a component and bezel to a support member. For example, the assembly may include a latch bracket for securing to a chassis of the product; a latch, extending from the latch bracket, for latching to the support member; and a lever, rotatably secured in the bezel, for releasing the latch from the support member during rotation.

In another embodiment, the description relates to a rack latch assembly including means for securing to a chassis of the component; means, extending from the securing means, for latching to the support member; and means, rotatably secured in the bezel, for releasing the latch means from the support member during rotation.

Also described is a lever assembly for a rack-mounted bezel, including a body having a top hinge post and a bottom hinge post; a wire spring having torsion loops at each end for wrapping around the top and bottom hinge posts, respectively; and a channel, formed in the body, for receiving the wire spring.

BRIEF DESCRIPTION OF THE DRAWINGS

Various aspects of the invention will now be described with reference to the following figures ("FIGS.") which are not necessarily drawn to scale, but use the same reference numerals to designate corresponding parts throughout each of the several views.

DETAILED DESCRIPTION

Figure 1:
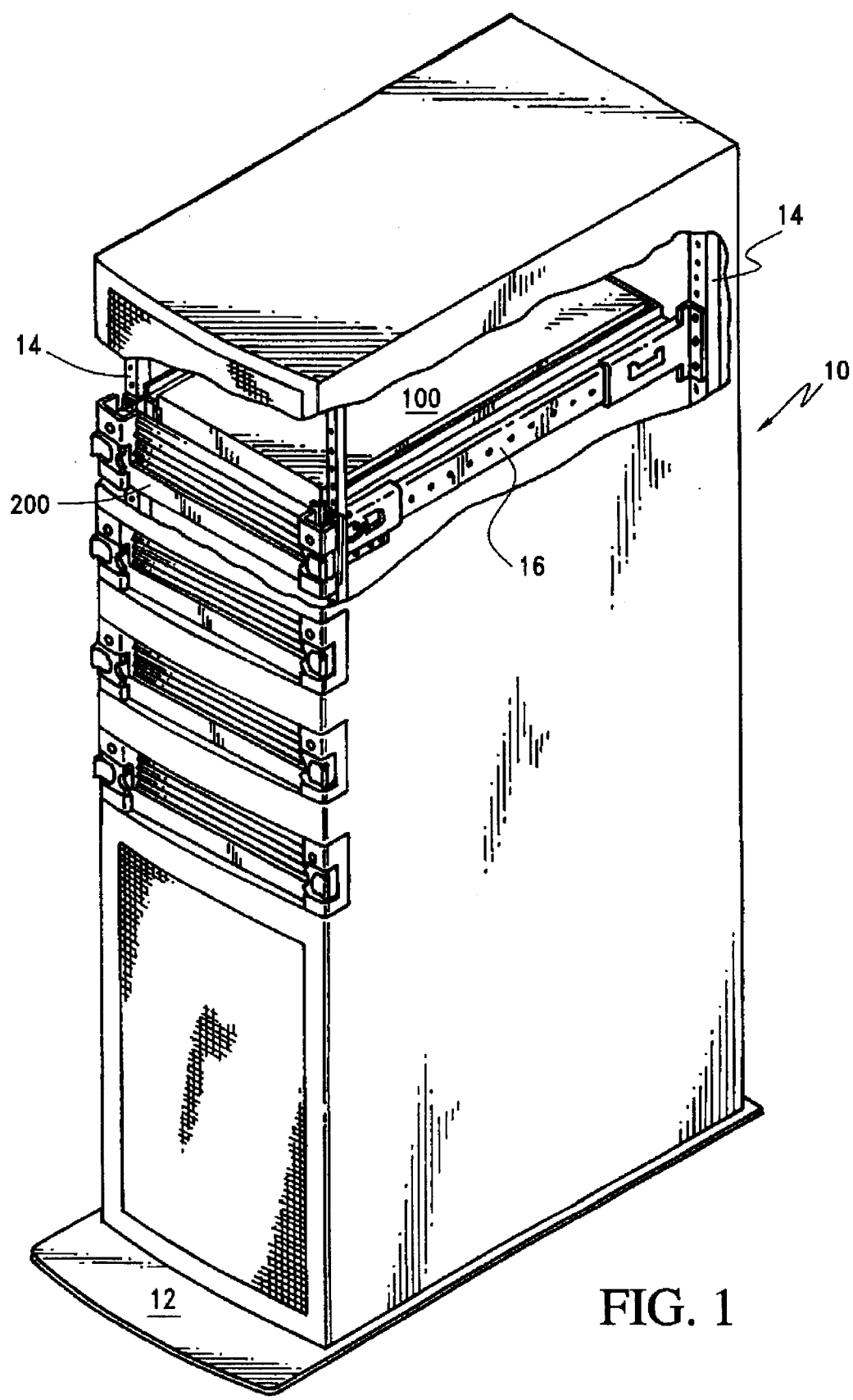
FIG. 1 is an isometric view of one embodiment of a rack according to the present invention.

The term "assembly" is used here to describe a group of assembled or unassembled component parts, such as those shown in FIGS. 2–11, that are configurable into a device. This term also refers to a process for configuring the parts into the assembled device that is generally referred to as a "rack latch" because it can be used with a "rack" frame or cabinet for releaseably fastening a slide, or other moveable component, in the rack. An example of one such rack 10 is illustrated in FIG. 1. However, the subject matter shown in FIGS. 2–11 may also be used with a variety of other racks besides the particular rack 10 which is illustrated in FIG. 1.

In this example, the rack 10 includes a base 12 that supports several columns 14. A rackmount assembly 16 extends between two of the columns for providing support to a component 100. (For example, one such rackmount assembly is described in U.S. patent application Ser. No. 10/094,860 for "Adjustable Rackmount Assembly" by Lauchner et al. filed on Mar. 11, 2002, and assigned to Hewlett-Packard Co.) A bezel 200 is then provided on the front of a rack 10 in order to hide various aspects of the rackmount assembly 16 and the component 100 from view. Bezels may also be provided on some, or all, of the other sides of a rack.

Figure 2:
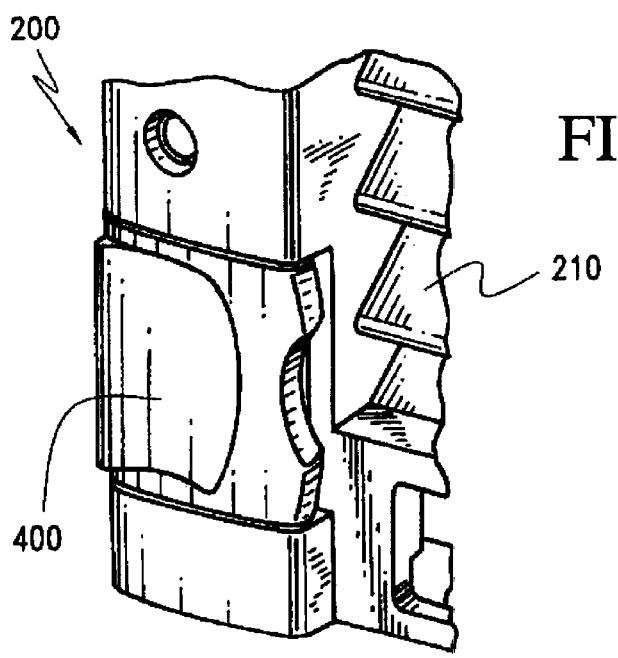
FIG. 2 is a partial front, isometric view of the bezel shown in FIG. 1.

FIG. 2 is a partial front, isometric view of one side of the bezel 200 shown in FIG. 1. The bezel 200 may be provided with louvers 210 and/or other mechanisms to provide for heat dissipation from inside the rack 10 and/or to contribute to an aesthetically-pleasing appearance for the front of the rack 10.

Figure 3:
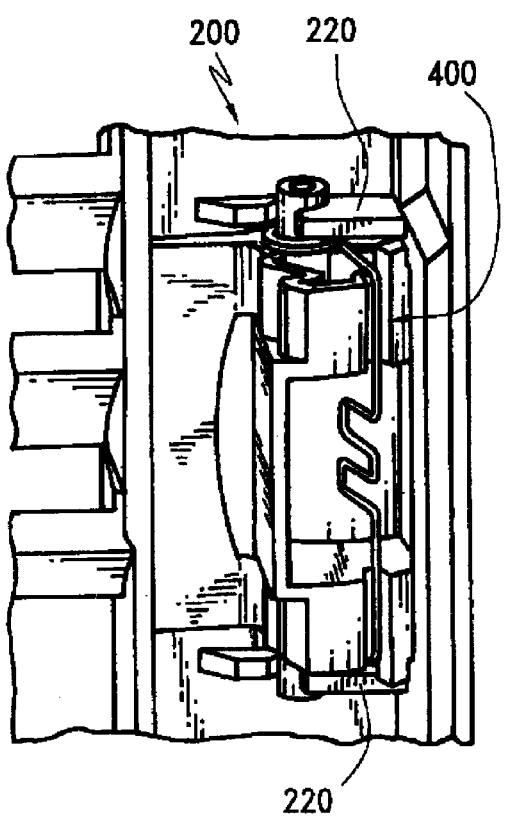
FIG. 3 is a partial, isometric back view of the bezel shown in FIG. 2.

As best illustrated in the rear view of FIG. 3, a lever assembly 400 is rotatably secured to the rear side of the bezel 200. For the particular embodiment illustrated in FIG. 3, the lever assembly 400 is supported by brackets 220 arranged on the back side of the bezel 200. However, a variety of other support mechanisms may also be used. Although a variety of hinged configurations may also be used, FIG. 3 illustrates the lever assembly 400 as being snap-fit into grooves in each of the brackets 220. This particular configuration is beneficial for enhancing the manufacturability and assembly of the bezel 200 with the lever assembly 400.

Figure 4:
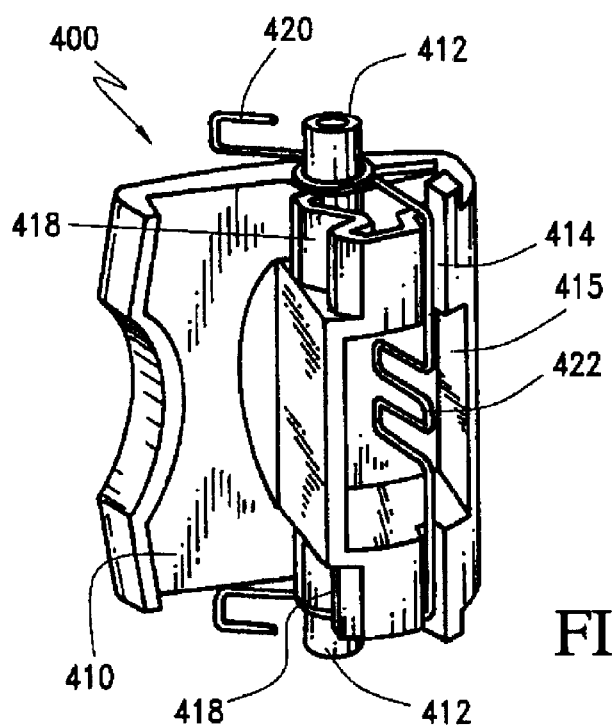
FIG. 4 is a back, isometric view of the lever assembly shown in FIG. 3.

Various aspects of the lever assembly 400 will now be described with respect to FIG. 4. The lever assembly 400 includes a lever 410 and one or more springs 420. The lever 410 may be made of the same material as the bezel 200. For example, the latch 400 may be made of molded plastic, or other lightweight material, with an aesthetically pleasing texture.

Hinge posts 412 are arranged at the top and bottom ends of the lever 410 for engaging with the hinge bracket 220 shown in FIG. 3. The illustrated hinge posts 412 form a journal bearing with the brackets 220. This configuration makes the lever assembly 400 easy to assemble with the bezel 200. However, a variety of other rotational attachments may also be used. For example, the end surfaces of the hinge posts 412 may be arranged to abut a surface of each of the hinge brackets 220 in order to form a thrust-type bearing.

The hinge posts 412 may also be used to support the spring 420. For the particular embodiment illustrated in FIG. 4, a wire spring is coiled at each end around the hinge posts 412. This configuration allows the spring to be easily fitted over the ends of the hinge posts 412 prior to securing the lever assembly 400 to the bracket 220.

In order to further facilitate the assembly of the wire spring 420 onto the hinge posts 412, the wire spring may be optionally provided with a serpentine portion 422. The serpentine portion 422 provides additional flexibility for bending the end of the ends of the spring 420 over the hinge posts 412. The serpentine portion 422 is therefor preferably arranged at a middle portion of the wire spring 420 with the curves arranged on a plane which bisects the longitudinal access of the hinge posts 412.

The lever 410 is preferably provided with a spring channel 414 for positioning the wire spring 420 relative to the access of the hinge posts 412. In order to accommodate the serpentine portion 422 of the spring 420, the channel 414 is further provided with a cavity 415 for receiving the serpentine portion 422 of the spring 420. The cavity 415 is also useful for accessing the serpentine portion 422 of the spring 420 in order to adjust the length of the spring to accommodate various size levers 410. For example, the spring 420 may be tightened on a smaller lever 410 by pinching the horizontal legs of the serpentine portion 422 of the spring 420 closer together. The lever 410 is also provided with a face 416 for engaging and releasing a latch and recesses 418 for engaging a hook as is described in more detail below.

Figure 5:
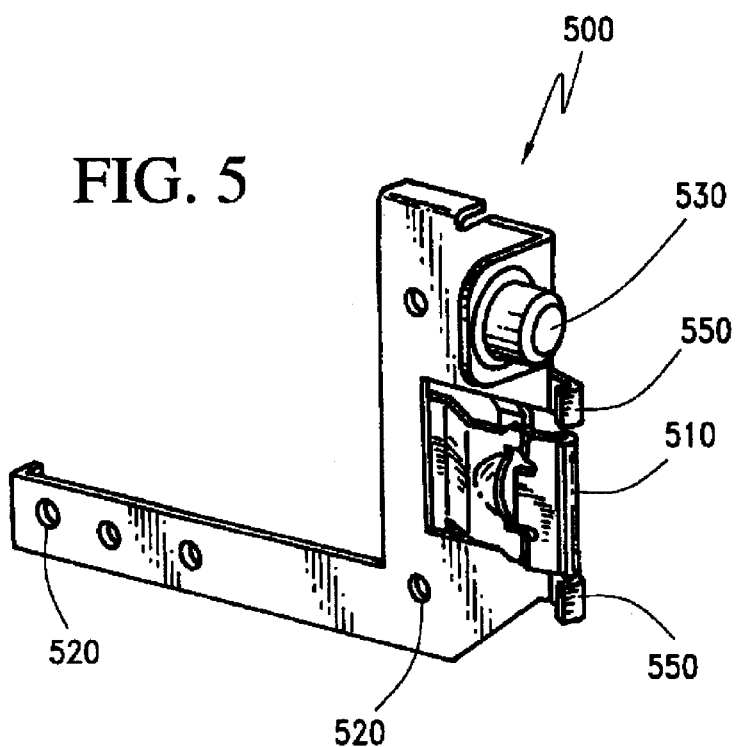
FIG. 5 is a front, isometric view of a latch assembly for use with the rack shown in FIG. 1.
Figure 7:
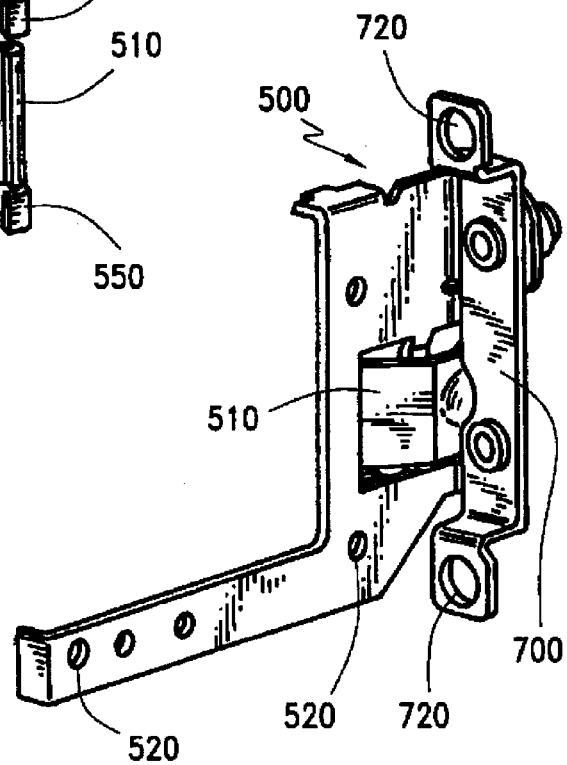
FIG. 7 is a rear, isometric view of the latch assembly shown in FIGS. 5 and 6, with a rack bracket.
Figure 6:
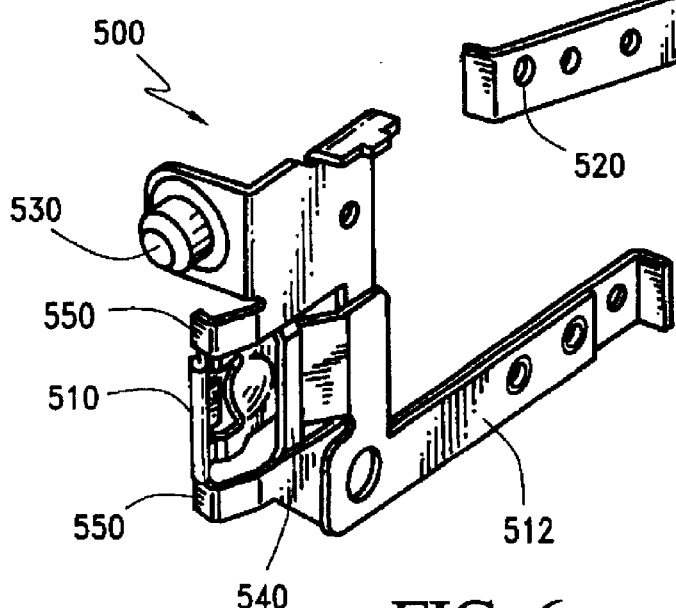
FIG. 6 is an opposite side, isometric view of the latch assembly shown in FIG. 5.

FIGS. 5–7 illustrate a latch assembly 500 including a movable catch 510 that catches on a rack bracket 700 as shown in FIG. 7. As described in more detail below with respect to FIGS. 9 and 10, the latch assembly 500 is secured to the component 100, typically at the chassis. In contrast, the rack bracket 700 (FIG. 7) is secured to the rackmount assembly 16 of the rack 10 (FIG. 1). In this regard, the latch assembly 500 and rack bracket 700 are provided with mounting holes 520 and 720, respectively. Any number and/or position of mounting holes 520, 720 may be provided in order to accommodate various components 100 and/or racks 10. The latch assembly 500 and rack bracket 700 may also be secured to their respective structures using a variety of other fastening and/or joining techniques.

In a typical configuration, the latch assembly 500 will be movable relative to the rack bracket 700 upon release of the catch 510 from the rack bracket 700. However, under certain circumstances it may be desirable to secure the latch assembly 500 to the rack bracket 700 in order to prevent such movement. For these circumstances, the latch assembly 500 may be provided with an optional floating captive fastener 530 for securing the latch assembly 500 to the rack bracket 700.

Movement of the catch 510 relative to the remainder of the latch assembly 500 may be facilitated in a variety of different ways. As best shown in FIG. 6, the exemplary embodiment illustrated here provides a cantilevered configuration where the catch 510 is mounted at the end of a catch arm 512 which is secured at one end to the latch assembly 500. For example, the latch arm 512 may be secured to the latch assembly 500 with various fastening and/or joining techniques including bolts, rivets, welding, or adhesives.

In this configuration, the catch arm 512 will be flexed as the catch 510 is moved away from the latch bracket 700. In order to prevent the catch arm 512 from swinging too far back in the opposite direction, the latch assembly 500 may also be provided with a catch stop 540. A variety of other rotational or translational connections may also be provided between the catch 510 or catch arm 512, and the latch assembly 500.

Figure 8:
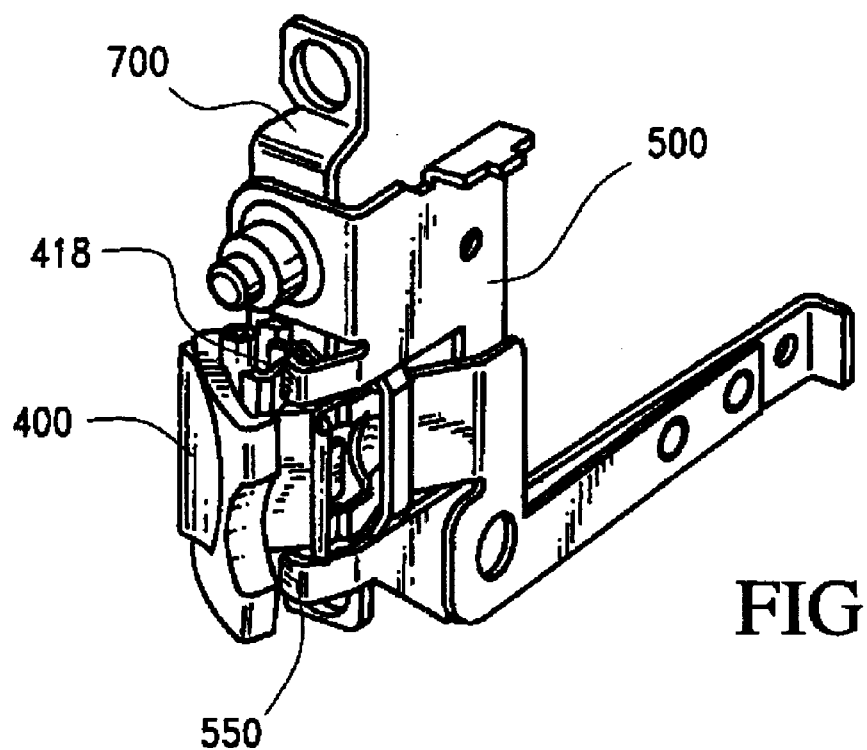
FIG. 8 is a front, isometric view of the latch assembly and rack bracket shown in FIG. 7 with the lever assembly in an open position.
Figure 9:
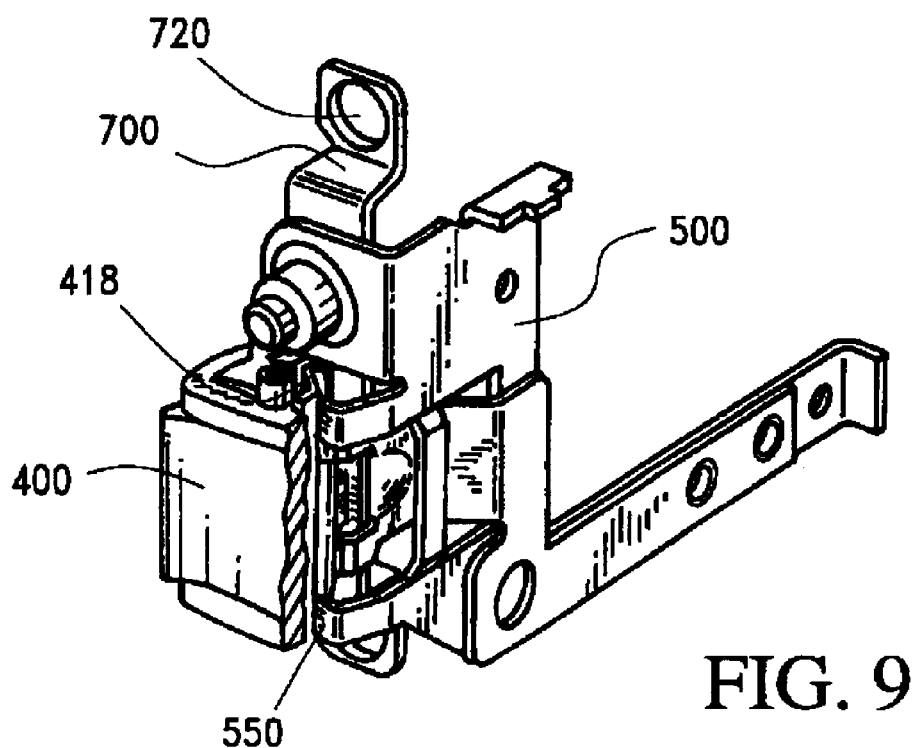
FIG. 9 is a front, isometric view of the latch assembly and rack bracket shown in FIG. 7 with the lever assembly in an closed position.

As best shown in FIGS. 5 and 6, the latch assembly 500 is further provided with hooks 550. Turning to FIGS. 8 and 9, the hooks 550 engage the hook recess 418 (FIG. 4) upon rotation of the lever 410 to the open position shown in FIG. 8. Upon release of the lever 410, the spring 420 (FIG. 4) urges the lever assembly 400 to rotate so that the hooks 550 are disengaged from the hook recess 418.

Once the lever is open and engaged with the latch hooks 550 (as shown in FIG. 8) a user may continue to pull on the levers 400 in order to slide the component 100 out of the rack. This sliding force is transmitted from the levers 400 through the latch assembly 500 to the component 100, thereby eliminating stresses on the bezel 200 (FIGS. 1 and 2) that might otherwise damage the relatively fragile decorative materials used for the bezel 200. The hooks 550 also prevent the bezel 200 from coming off when a user pulls on the levers 400.

Once the levers 400 are released, the bezel 200 (FIGS. 1 and 2) can then be removed without further movement of the component 100. Conversely, sliding the component 100 into the rack 10 does not necessarily require rotation of the levers 410. Thus, the component 100 can simply be pushed into the rack so that it latches automatically.

Figure 10:
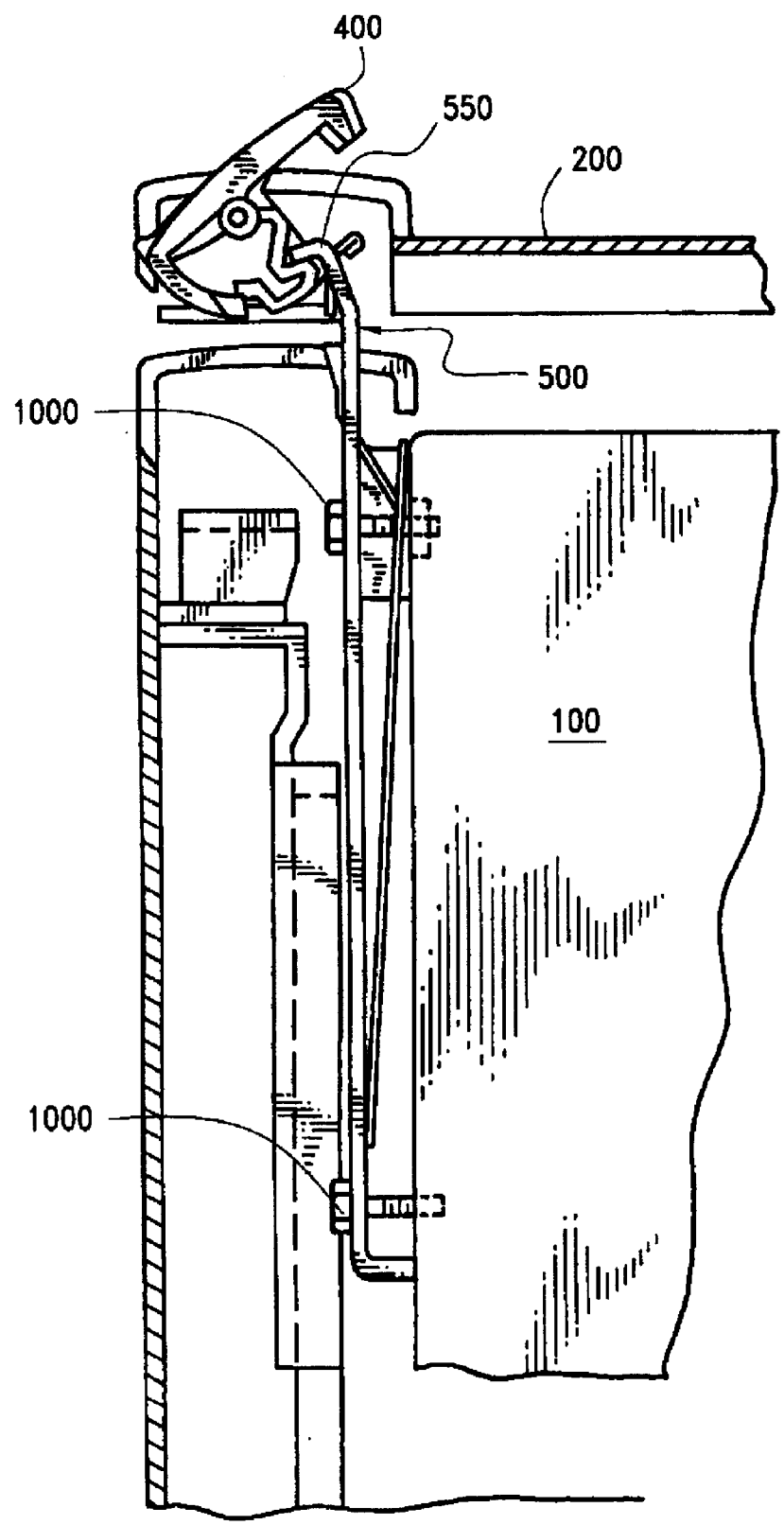
FIG. 10 is a bottom view of the assembly shown in FIG. 8 positioned in the rack shown in FIG. 1.
Figure 11:
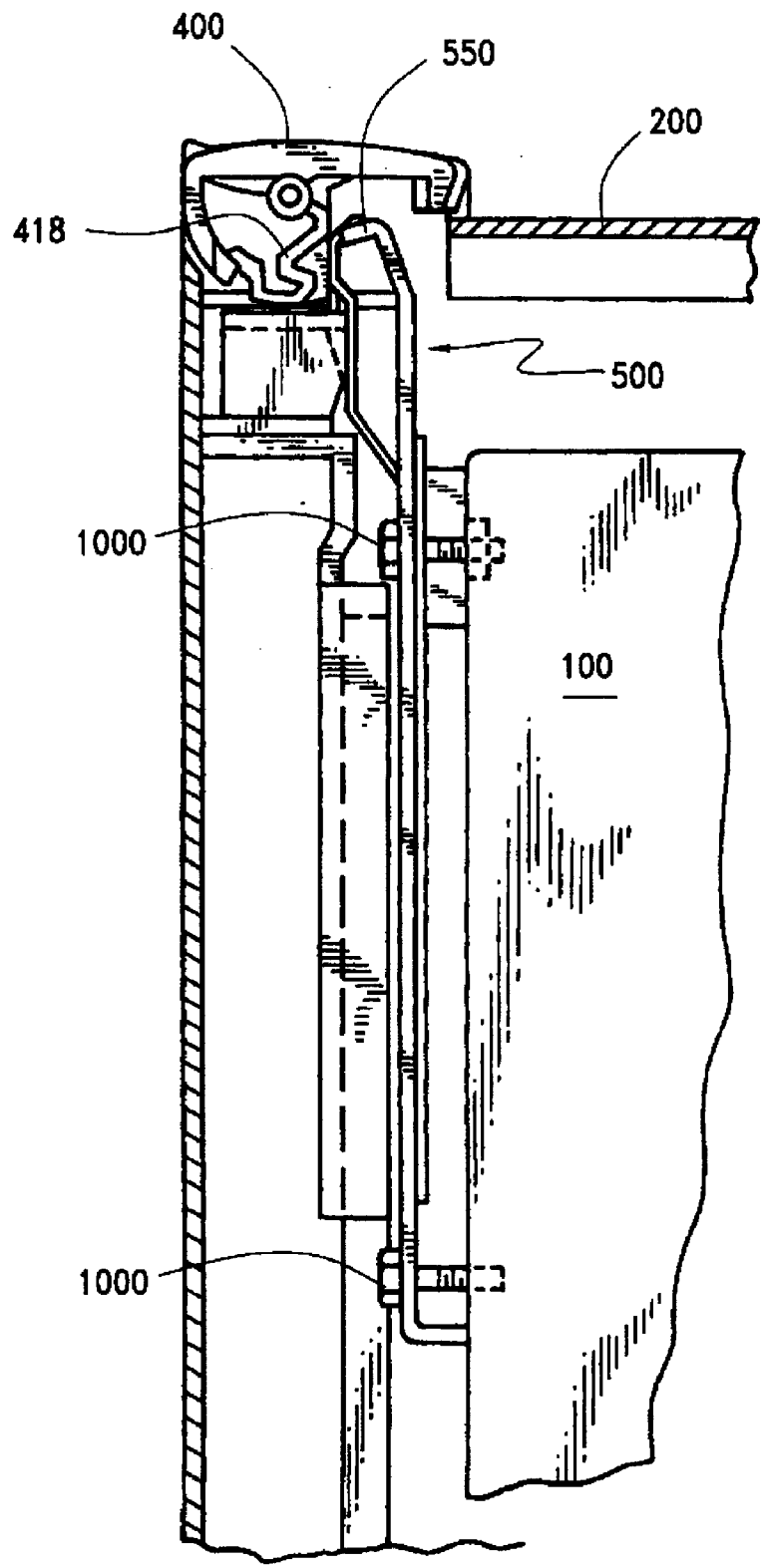
FIG. 11 is a bottom view of the assembly shown in FIG. 9 positioned in the rack shown in FIG. 1.

Turning to FIGS. 10 and 11, the latch assembly 500 is typically secured to the chassis of the component 100 by bolts 1000. However, a variety of other fasteners may also be used including screws and clips. The latch assembly may also be joined to the component 100 by various processes such as welding or adhesive processes.

It should be emphasized that the embodiments described above, and particularly any "preferred" embodiments, are merely examples of various implementations that have been set forth here to provide an understanding of various aspects of the invention. One of ordinary skill will be able to alter many of these embodiments without substantially departing from the scope of protection defined solely by the proper construction of the following claims.

What is claimed:

1. A rack latch assembly for slideably securing a product and bezel to a rack, comprising:

a latch bracket for securing to the product;

a latch, extending from the latch bracket, for latching to the rack; and a lever, rotatably secured in the bezel, for releasing the latch from the rack during rotation.

2. The assembly recited in claim 1, wherein:

said latch bracket further comprises a hook at one end thereof; and said lever further comprises:

a face for engaging and releasing the latch from the rack; and a recess for engaging the hook upon full rotation of the lever.

3. The assembly recited in claim 1, further comprising a fastener for fixing the latch bracket to the rack.

4. The assembly recited in claim 1, further comprising a spring mounted on the lever for biasing the rotation of the lever.

5. The assembly recited in claim 2, further comprising a fastener for fixing the latch bracket to the rack.

6. The assembly recited in claim 2, further comprising a spring mounted on the lever for biasing the rotation of the lever.

7. The assembly recited in claim 3, further comprising a spring mounted on the lever for biasing the rotation of the lever.

8. The assembly recited in claim 5, further comprising a spring mounted on the lever for biasing the rotation of the lever.

9. A lever assembly for a rack-mounted bezel, comprising:

a body having a top hinge post and a bottom hinge post extending therefrom;

a wire spring having torsion loops at each end for wrapping around the top and bottom hinge posts, respectfully; and a channel, formed in the body, for receiving the wire spring.

10. The lever assembly recited in claim 9, wherein the channel comprises a section for receiving a serpentine portion of the wire spring.

11. The lever assembly recited in claim 9, wherein the body further comprises a bracket-engaging recess.

12. The lever assembly recited in claim 9, wherein the body further comprises a latch-engaging face.

13. The lever assembly recited in claim 10, wherein the body further comprises a bracket-engaging recess.

14. The lever assembly recited in claim 10, wherein the body further comprises a latch-engaging recess.

15. The lever assembly recited in claim 13, wherein the body further comprises a latch-engaging face.

16. A method for removing a component and bezel from a rack, comprising the steps of:

rotating a lever on the bezel whereby the lever displaces a catch and engages a hook on a latch assembly that is secured to the component; and pulling on the engaged lever away from the rack.

* * * * *